(12) United States Patent
Schröder et al.

(10) Patent No.: US 7,443,713 B2
(45) Date of Patent: Oct. 28, 2008

(54) INTEGRATED SEMICONDUCTOR MEMORY AND METHOD FOR OPERATING A SEMICONDUCTOR MEMORY

(75) Inventors: Stephan Schröder, München (DE);
Herbert Benzinger, München (DE);
Georg Erhard Eggers, München (DE);
Manfred Pröll, Dorfen (DE); Jörg Kliewer, München (DE)

(73) Assignee: Infineon Technologies AG, Neubiberg (DE)

( * ) Notice: Subject to any disclaimer, the term of this patent is extended or adjusted under 35 U.S.C. 154(b) by 226 days.

(21) Appl. No.: 11/331,365

(22) Filed: Jan. 13, 2006

(65) Prior Publication Data
US 2006/0193168 A1 Aug. 31, 2006

(30) Foreign Application Priority Data
Jan. 25, 2005 (DE) .................. 10 2005 003 461

(51) Int. Cl.
*G11C 11/02* (2006.01)
(52) U.S. Cl. .................. 365/149; 365/150; 365/185.05; 365/185.08
(58) Field of Classification Search .................. 365/149, 365/150, 185.08, 185.05
See application file for complete search history.

(56) References Cited

U.S. PATENT DOCUMENTS

| 5,018,105 | A  | * | 5/1991  | Miyanishi  | 365/203 |
| 5,367,481 | A  | * | 11/1994 | Takase et al. | 365/149 |
| 6,198,654 | B1 | * | 3/2001  | Ashikaga   | 365/145 |
| 6,906,945 | B2 | * | 6/2005  | Madan      | 365/145 |
| 7,095,666 | B2 | * | 8/2006  | Foss       | 365/207 |
| 2002/0085408 | A1 | * | 7/2002 | Ricodeau | 365/149 |
| 2003/0002319 | A1 | * | 1/2003 | Ricodeau | 365/149 |

FOREIGN PATENT DOCUMENTS

DE 103 34 424 A1 8/2004

\* cited by examiner

*Primary Examiner*—Pho M. Luu
(74) *Attorney, Agent, or Firm*—Edell, Shapiro & Finnan, LLC

(57) ABSTRACT

An integrated semiconductor memory device includes at least one memory cell, at least one sense amplifier and a pair of bit lines connected to each sense amplifier, where each memory cell includes a selection transistor and a storage capacitor. The storage capacitor of each memory cell includes a first capacitor electrode and a second capacitor electrode, and the selection transistor of each memory cell includes a first source/drain region that is connected by a first contact connection to one bit line of a pair of bit lines corresponding with the memory cell, and a second source/drain region that is conductively connected to the first capacitor electrode of the storage capacitor of the memory cell. The second capacitor electrode of the storage capacitor of each memory cell is connected to the other bit line of the pair of bit lines corresponding with the memory cell.

22 Claims, 4 Drawing Sheets

INTEGRATED SEMICONDUCTOR MEMORY AND METHOD FOR OPERATING A SEMICONDUCTOR MEMORY

CROSS REFERENCE TO RELATED APPLICATIONS

This application claims priority under 35 U.S.C. §119 to German Application No. DE 10 2005 003461.6, filed on Jan. 25, 2005, and titled "Integrated Semiconductor Memory And Method For Operating A Semiconductor Memory," the entire contents of which are hereby incorporated by reference.

FIELD OF THE INVENTION

The invention relates to an integrated semiconductor memory having at least one memory cell, which has a selection transistor and a storage capacitor, and having at least one sense amplifier and having a pair of bit lines connected to the same sense amplifier. The invention furthermore relates to a method for operating such a semiconductor memory.

BACKGROUND

Integrated semiconductor memories have a memory cell array having a multiplicity of memory cells connected to word lines and bit lines. In the case of volatile semiconductor memories, in particular DRAMs (dynamic random access memory), each memory cell has a selection transistor and a storage capacitor. The selection transistor is usually a MOSFET (metal oxide semiconductor field effect transistor) having two source/drain regions which are arranged in a semiconductor substrate and between which a transistor channel can be formed. Arranged above the channel region for the transistor channel is a gate dielectric and above that a gate electrode, which forms an interconnect section of the word line to which the memory cell is connected. One of the two source/drain regions is connected to the bit line; the other source/drain region of the selection transistor is conductively connected to a first capacitor electrode of the storage capacitor. In addition to the first capacitor electrode, the storage capacitor furthermore has a second capacitor electrode, which is separated from the first capacitor electrode by a capacitor dielectric. The storage capacitor is usually formed as a trench capacitor arranged within the semiconductor substrate, or as a stacked capacitor arranged outside the semiconductor substrate.

Volatile memory cells formed in this way store digital information in the form of quantities of electrical charge that are stored in the storage capacitor if the selection transistor of the memory cell is turned off. In order to read out the memory information, the selection transistor is turned on and the bit line to which the memory cell is connected is subjected to charge reversal on account of the previously stored charge of the storage capacitor. As a result, the electrical potential of the bit line to which the selection transistor of the memory cell is connected is altered after the selection transistor has been opened. In DRAMs, there are always two bit lines connected to one and the same sense amplifier, also called signal amplifier. The sense amplifier serves for amplifying the difference between the electrical potentials of the two bit lines which are connected to it, that is to say for spreading the difference between the two electrical potentials of the bit lines. In order to read out memory data, firstly the two bits lines are biased with a precharge potential, the level of which usually lies in the middle between a neutral potential and a first potential corresponding to the potential of a bit line that is biased with a digital "1" and thus activated. The precharge potential is often abbreviated to Vbleq and the first potential to Vblh. The neutral potential is a reference potential of, for example, 0 volts (ground potential). A bit line with the aid of which a digital "0" is written to the memory cell when the potentials are spread is biased with the neutral potential. Consequently, the sense amplifier effects an increase in the bit line potential from the precharge potential to the potential Vblh if a digital one is written back, and a decrease in the bit line potential from the precharge potential Vbleq to the neutral potential if a digital zero is written back.

The read-out and spreading of the bit line potential are effected after first of all the word line of the selection transistor is activated and the selection transistor is thereby turned on, so that, on account of the quantity of charge of the storage capacitor that is distributed onto the bit line, an initially slight, but measurable potential difference with respect to the potential of the other bit line connected to the same sense amplifier is produced. The sense amplifier subsequently amplifies the potential difference between the two bit lines. As a result, the storage capacitor of the memory cell is subjected to charge reversal via those bit lines to which the memory cell is connected. The transistor is subsequently turned off again by deactivating the word line and thereby interrupting the formation of the transistor channel.

Integrated semiconductor memories are being fabricated with increasingly miniaturized dimensions of the memory cells and of the rest of the structure elements on the semiconductor substrate in order to obtain a maximum memory cell density per basic substrate area. In particular, the dimensioning of the word lines is being made narrower and the gate lengths are thereby being shortened. As the size of the structure elements of the semiconductor memory is reduced, the required operating voltages of the selection transistors also decrease since the threshold voltage of the selection transistor decreases as the gate length decreases. The reduction of the operating voltage of the selection transistors accords with the requirement for reducing the current consumption of the semiconductor memory. However, it is not possible to miniaturize the transistors contained in the sense amplifier to the same extent as the selection transistors of the memory cells. One reason for this is that the sense amplifier is used to generate a voltage boost that requires the transistors of the sense amplifier to have larger dimensions. Therefore, the operating voltage of the sense amplifier cannot be lowered in the same way as that of the selection transistors.

In the case of so called "mid-level sensing", in which the bit lines are biased, prior to the opening of the selection transistors, with a precharge potential lying precisely in the middle between a first bit line potential corresponding to a digital "1" and a second bit line potential corresponding to a digital "0", the quantity of charge required for the charge reversal of the bit line, that is to say the current consumption, is particularly low. This is due to the fact that the potential Vblh for an activated bit line, which corresponds to a digital "1" and the neutral potential of a bit line, which corresponds to a digital "0", in each case have the same potential difference with respect to the precharge potential Vbleq. Therefore, the same quantity of charge is required for writing a digital zero to the memory cell read first of all and for writing a digital one.

However, if the selection transistors of the memory cells are provided with smaller dimensions than those of the sense amplifiers and are additionally operated with smaller operating voltages, then the threshold voltage of the transistors of the sense amplifier and hence the operating point of the sense amplifier is greater than the precharge potential Vbleq of the selection transistors, at least when using mid-level sensing. If the selection transistors are biased with the precharge potential prior to the read-out, the sense amplifier is then no longer operated at its optimum operating point, but rather with a smaller voltage in comparison therewith. As a result, the evaluation of the bit line signals takes longer and a larger spreading, that is to say a larger voltage amplification by the signal amplifier is required than if the signal amplifier were operated at a voltage corresponding to its operating point.

A further problem of present-day semiconductor memories consists in the fact that in a sense amplifier, transistors whose operating point corresponds to a higher voltage than the potential Vbleq of the selection transistors operated with mid-level sensing, the switching signal for writing back a digital one (corresponding to the bit line potential Vblh) becomes weaker. This is because if the operating point of the sense amplifier is greater than the precharge potential Vbleq, the potential difference between the operating point of the sense amplifier and the potential Vblh is smaller. Although in return the signal for writing back a digital zero is all the larger, sufficiently fast programming of the two data values zero and one nonetheless requires a sufficiently high signal strength.

SUMMARY

The present invention provides a semiconductor memory which can be operated reliably, and has an increased switching speed, even when operating voltages of selection transistors and sense amplifiers are different from one another. In particular, the semiconductor memory obtains a higher signal strength for the charge reversal of bit lines, without increasing the current consumption of the semiconductor memory. The semiconductor memory operates with greater reliability than conventional semiconductor memories independently of whether the operating voltage of its selection transistors and that of its sense amplifiers are identical in magnitude or different in magnitude. Therefore, the present invention provides a method for reliably operating such a semiconductor memory.

In accordance with the present invention, an integrated semiconductor memory is provided comprising at least one memory cell, which has a selection transistor and a storage capacitor, at least one sense amplifier and a pair of bit lines connected to the sense amplifier, the storage capacitor having a first and a second capacitor electrode, the selection transistor having a first source/drain region, which is connected by a first contact connection to one bit line of the pair of bit lines, and a second source/drain region, which is conductively connected to the first capacitor electrode of the storage capacitor, and the second capacitor electrode of the storage capacitor being connected to the other bit line of the pair of bit lines.

The invention proposes, in the case of a volatile semiconductor memory having memory cells which each have a selection transistor and a storage capacitor, connecting the second capacitor electrode, which is not connected to the selection transistor, to the second bit line of the bit line pair. Conventionally, memory cells are connected exclusively to a single bit line via their selection transistor and the potential of said bit line, after the selection transistor has been opened, is compared with the potential of the complementary bit line, that is to say the second bit line of the bit line pair, which is likewise connected to the same signal amplifier. Therefore, in a conventional semiconductor memory, each memory cell is only connected to a signal bit line. According to the invention, however, a semiconductor memory is proposed in which the memory cells are additionally connected to the respectively complementary bit line, to be precise by means of a conductive connection between the second capacitor electrode and the complementary bit line.

This measure appears to contradict the conventional construction and the conventional mode of operation of nonvolatile semiconductor memories, since now the two bit lines whose potentials are to be compared with one another and spread by the sense amplifier are connected to the memory cell. Conventionally, the second capacitor electrodes of all the memory cells are in each case biased with a neutral potential, for instance the ground potential, and additionally short-circuited among one another. By way of example, in the case of trench capacitors, the outer capacitor electrodes are short-circuited among one another by a buried doped layer and biased by the latter with the ground potential or some other potential.

Connecting a single memory cell to two mutually complementary bit lines appears at first glance to preclude a functioning of the memory cells. The semiconductor memory according to the invention can nevertheless be operated reliably because the first capacitor electrode is connected to one bit line of the bit line pair (namely via the turned-on selection transistor) and the second capacitor electrode is connected to the other bit line of the bit line pair and the electrical connection between the second capacitor electrode and the other bit line of the bit line pair exists permanently, that is to say independently of the switching state. This has the effect that after the spreading of the bit line potentials, the second electrode is also biased directly via the complementary bit line, to be precise with a reverse trend with respect to the first capacitor electrode. As a result, a much higher voltage can be applied to the storage capacitor than if, as is conventional, only a single capacitor electrode is subjected to charge reversal. This increase in the signal strength when refreshing or overwriting the memory cell is achieved without any increase in the operating voltage or current consumption. Consequently, the conductive connection of the second capacitor electrode to the other bit line of the bit line pair results in a significantly higher signal strength when subjecting the storage capacitor to charge reversal, to be precise even when the operating voltages of the selection transistors and of the transistors of the sense amplifier remain unchanged. The increase achieved in the signal strength when subjecting the storage capacitor to charge reversal results in an increased switching speed and reliability of the data evaluation which makes dependable operation of the semiconductor memory independent of a possible deviation of the operating voltages of the selection transistors and of the transistors of the sense amplifier from one another. Possible problems that would arise on account of reduced operating voltages of the selection transistors on account of a deviation from mid-level sensing or on account of operation of the sense amplifier outside the optimum operating point of its transistors are more than compensated for in the case of the semiconductor memory according to the invention. The signal delays or signal fluctuations that possibly arise on account of the problems outlined are compensated for by the increased signal strength obtained by means of the two capacitor electrodes being subjected to charge reversal in accordance with the invention.

It is preferably provided that the second capacitor electrode is connected by a second contact connection to the other bit line of the pair of bit lines. Just like the first contact connection, which connects the first source/drain region of the selection transistor to one bit line, the second contact connection may be a contact hole filling (via). The second contact connection may likewise be formed in a different way. It only has to produce a conductive connection between the other bit line of the bit line pair and the second capacitor electrode in order to subject the second electrode to charge reversal through the spreading of the bit line potentials. In this case, the charge reversal of the second electrode is not effected merely as a consequence of the charge reversal of the first electrode, as in the case of a conventional storage capacitor, rather the second electrode, just like the first electrode of the storage capacitor, is in each case electrically connected to a dedicated connection of the sense or signal amplifier. Whereas conventionally only one of the spread bit line potentials is used for the charge reversal of the storage capacitor, according to the invention the two mutually spread potentials output by the sense amplifier are used for the charge reversal of a respective capacitor electrode. Without altering the rest of the structure elements of the semiconductor memory and with the same functioning, this results maximally in a quadrupling of the voltage applied to the capacitor. This is because conventionally only the potential difference between one bit line (for instance after the biasing thereof with Vblh) and the precharge potential Vbleq is utilized for the charge reversal of the storage capacitor. In this case, Vbleq is approximately half as large as Vblh. According to the invention, by contrast, the voltage difference between Vblh and −Vblh is made available for the charge reversal of the storage capacitor, to be precise by means of the two sense amplifier connections that are conductively connected to a respective capacitor electrode. Even in the case where the useable voltage is reduced by a widening of the layer thickness of the capacitor dielectric or by other influences, a considerable amplification of the electrical signals is achieved when refreshing and overwriting memory cells.

Accordingly, it is provided that the memory cell is connected between the two bit lines of the pair of bit lines by the first and the second contact connection.

It is preferably provided that the two bit lines of the pair of bit lines which are connected to the sense amplifier can be biased in such a way that an existing potential difference between a potential of one bit line and a potential of the other bit line of the pair is increased, one of the two bit lines being biased with a first potential, which is output at a first connection of the sense amplifier and the other bit line of the pair being biased with a second potential, which is output at a second connection of the sense amplifier. Although the sense amplifier functions in exactly the same way as in the case of a conventional semiconductor memory, according to the invention not just one but both spread potentials with which the sense amplifier biases the bit lines at its two connections are forwarded to the capacitor.

It is preferably provided that the semiconductor memory is controlled in such a way that during the refresh of a memory content of the memory cell, each of the two bit lines of the pair of bit lines which are connected to the same sense amplifier biases in each case one of the two capacitor electrodes of the storage capacitor of the memory cell. By way of example, the first capacitor electrode is biased with the potential Vblh by means of one bit line to which the selection transistor of the memory cell is connected, and the second capacitor electrode is biased with the potential −Vblh via the other bit line, or vice versa.

It is preferably provided that the semiconductor memory has a multiplicity of memory cells which are in each case connected to both bit lines of the pair of bit lines, the selection transistors of the memory cells furthermore being connected to word lines which run in the direction transversely with respect to the course of the bit lines, and the first and the second source drain region of each selection transistor being arranged offset with respect to one another in the direction of the course of the word lines. This facilitates, as will be explained below, the electrical connection of the memory cell from two sides to the two bit lines with the aid of contact hole fillings such as run below the two bit lines in each case perpendicularly in the direction of the subject surface. The selection transistor, the two source/drain regions of which are offset with respect to one another in the direction transversely with respect to the course of the bit lines, bridges the lateral distance of the two complementary bit lines.

Consequently, it is provided, in particular, that in each memory cell, one of the two source/drain regions of the selection transistor is arranged in a substrate region of a semiconductor substrate which is covered by one bit line of the pair of bit lines, and the respective other source/drain region of the selection transistor is arranged in a substrate region of the semiconductor substrate which is covered by the other bit line of the pair of bit lines. In addition, the two source/drain regions may, moreover, extend over a substrate region which is not covered either by the first or by the second bit line, but rather is arranged between the two bit lines. The transistor channel will in each case run obliquely with respect to the direction of the course of the bit lines and thus also obliquely with respect to the direction of the course of the word lines.

It is preferably provided that the semiconductor memory has at least one first memory cell, the selection transistor of which is connected by a first contact connection to a first bit line of the pair of bit lines, and a second memory cell, the selection transistor of which is connected by a second contact connection to a second bit line of the pair of bit lines. In principle, there would also be the possibility of forming all the memory cells, which according to the invention are connected both to the first bit line and to the second bit line, in such a way that they are always connected by their selection transistor to the first bit line via the first contact connection and by their storage capacitor to the second bit line via the second contact connection. All the selection transistors would then be connected to the first line and all the storage capacitors to the second line. Since, however, the capacitances of the two bit lines thereby differ significantly from one another on account of the different numbers of capacitor electrodes connected thereto, it is preferably provided that the same number of transistors are connected by a selection transistor to the first bit line and by their selection transistor to the second bit line. Correspondingly, the same number of second capacitor electrodes of storage capacitors are connected to the first bit line and to the second bit line. As a result, the same signal strength, in particular the same quantity of charge, is in each case required for the charge reversal of the first or the second bit line.

It is preferably provided that the second capacitor electrode of the storage capacitor of the first memory cell is connected by a second contact connection to the second bit line of the pair of bit lines and the second capacitor electrode of the storage capacitor of the second memory cell is connected by a second contact connection to the first bit line of the pair of bit lines.

It is correspondingly provided that the first and the second memory cell are connected oppositely in parallel with one another to the two bit lines which are connected to the same sense amplifier. Connecting up the two memory cells oppositely in parallel means that the selection transistor of one memory cell and the storage capacitor of the other memory cell are connected to the same bit line. In particular, in this case the first source/drain region of one memory cell is short-circuited with the second electrode of the storage capacitor of the other memory cell. This short circuit is effected via the bit line to which both are connected.

It is preferably provided that the semiconductor memory has pairs of in each case two memory cells, the selection transistors of which are connected by in each case the same first contact connection to a bit line of the pair of bit lines. As a result, a smaller number of first contact connections are required for connecting all the selection transistors to the bit lines. In the case of the semiconductor memory according to the invention, however, the second capacitor electrodes of the storage capacitors of the memory cell pair are at the same time connected to the other bit line in each case by means of a separate second contact connection.

It is preferably provided that a first contact connection of a pair of first memory cells connects the selection transistors thereof to the first bit line of the pair of bit lines, and a first contact connection of a pair of second memory cells connects the selection transistors thereof to the second bit line of the pair of bit lines. In this embodiment, provision is made not only of pairs of (first) memory cells whose common first contact connection is connected to the first bit line, but also of pairs of further (second) memory cells whose common first contact connection is connected to the second bit line. This ensures that an equal number of contact connections is arranged at each of the two bit lines. The number of contact connections per bit line is the sum of the first and the second contact connections which are connected to this bit line. By alternately connecting selection transistors of memory cell pairs via first contact connections alternately to the first and the second bit line, it is possible for the memory cells to be arranged just as densely as in conventional semiconductor memories, although now each memory cell has two bit line connections instead of only a single bit line connection.

It is preferably provided that the number of first memory cells, the selection transistors of which are connected to the first bit line of the pair of bit lines is equal in magnitude to the number of second memory cells, the selection transistors of which are connected to the second bit line of the pair of bit lines.

In particular, it is provided that the storage capacitors of the memory cells are stacked capacitors. Stacked capacitors are formed outside the semiconductor substrate, above the selection transistors; they are situated for example between the planes in which the word lines and the bit lines run. In the case of stacked capacitors, the second contact connections which connect the second capacitor electrodes to the complementary bit lines can be realized particularly simply in terms of fabrication technology. In the simplest case, the second contact connections are contact hole fillings (vias) which extend from the respectively complementary bit line as far as the second capacitor electrode.

It is preferably provided that the stacked capacitors are arranged at a level between a surface of the semiconductor substrate and the bit lines.

In particular, it is provided that in each memory cell, the first capacitor electrode of the storage capacitor is arranged closer to the surface of the semiconductor substrate than the second capacitor electrode and is connected to the second source/drain region of the respective selection transistor by a contact hole filling, which covers the same region of the semiconductor substrate as the second contact connection. In this embodiment, the second contact connection, which connects the complementary bit line to the second capacitor electrode, and the memory-cell-internal contact connection, which connects the second source/drain region to the first capacitor electrode, are arranged one above the other, so that they both cover the same region of the semiconductor substrate. The external dimensions of these two contact connections are aligned with one another as viewed in the direction perpendicular to the surface of the semiconductor substrate. In this case, there is the greatest possible freedom of choice for the configurations of the lateral dimensioning of the stacked capacitor which is connected at a level between these two contact connections. The two contact connections are preferably produced as contact hole fillings.

It is provided that the first and the second bit line which are connected to the same sense amplifier are mutually complementary bit lines. The electrical potentials of two complementary bit lines are always spread oppositely by the sense amplifier; this mechanism is utilized according to the invention for increasing the signal strength when overwriting and refreshing memory cell contents. As a result, a considerably higher voltage is applied to the storage capacitors before the selection transistors are turned off again.

It is preferably provided that the selection transistors of the memory cells are field effect transistors. Furthermore, it is finally provided that the semiconductor memory is a volatile random access memory.

The invention further provides a method for operating the semiconductor memory in which case, for instance when refreshing and/or overwriting a memory content of a memory cell, the selection transistor of the memory cell is opened and a potential difference between potentials of the two bit lines of the pair of bit lines which are connected to the sense amplifier is amplified in the sense amplifier, the first capacitor electrode of the storage capacitor of the memory cell being biased with a first potential via a bit line of the pair of bit lines that is connected to a first connection of the sense amplifier and via the first contact connection, and the second capacitor electrode of the storage capacitor being biased with another, second potential via a bit line of the pair of bit lines that is connected to a second connection of the sense amplifier and via the second contact connection.

The biasing of the two capacitor electrodes with the aid of the potentials which are spread by the sense amplifier and forwarded via the connections of the sense amplifier, the bit lines and the contact connections of the memory cells can be performed in particular when refreshing memory data and when writing to memory cells.

It is preferably provided that the first potential and the second potential with which the two capacitor electrodes of the memory cell are biased have a potential difference having an identical magnitude, but opposite sign, with respect to a neutral potential. The neutral potential may be for example the ground potential of zero volts or some other reference potential. Relative to this potential, the first potential may for example have the value +Vblh and the second potential the value −Vblh, or vice versa. The precharge potential, by contrast, with which conventionally the mutually complementary bit lines are biased prior to the opening of the memory cells, is only half as large as Vblh in terms of magnitude. By utilizing the second potential of the sense amplifier of approximately −Vblh, which has a potential difference with respect to the precharge potential that is three times as large as that of the potential +Vblh, a considerably higher signal strength is achieved for the charge reversal of the storage capacitors given the same operating voltage of the sense amplifier.

It is correspondingly provided that prior to a refresh of a memory content of a memory cell, the two bit lines to which the memory cell is connected via the first and the second contact connection are biased with a precharge potential having a potential difference with respect to the neutral potential that is half as large as that of the first potential.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
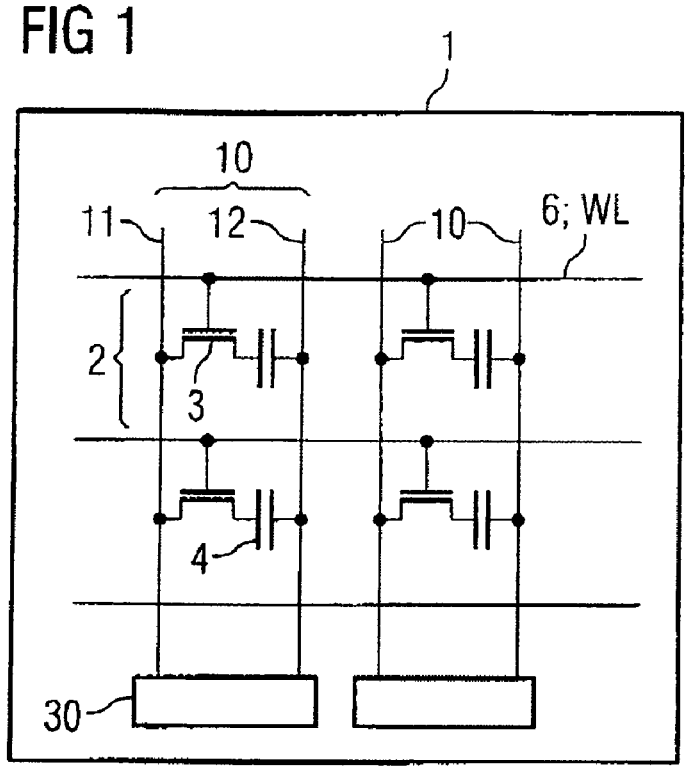
FIG. 1 shows a schematic plan view of a semiconductor memory according to the invention.

FIG. 1 shows a schematic plan view of a semiconductor memory 1 according to the invention, which has a multiplicity of memory cells 2 each connected to bit lines 11, 12 and to word lines 6. In each case pairs 10 of bit lines 11, 12 are connected to the same sense amplifier 30, which compares the electrical potentials of the two mutually complementary bit lines 11, 12 with one another, amplifies a possible potential difference and writes the amplified potentials back onto the bit lines. As a result, initial slight potential differences are amplified, that is to say that the bit line potentials are spread. Each memory cell 2 has a selection transistor 3 and a storage capacitor 4, which is preferably formed as a stacked capacitor. According to the invention, that capacitor electrode of the storage capacitor 4 which is not connected to the selection transistor 3 is connected to the complementary bit line 12 of the bit line pair 10 that is not connected to the selection transistor 3. This increases the storage charge of the capacitor when writing back the information read out, since a much higher charge reversal voltage is applied to the storage capacitor 4. As a result, overall an up to four-fold higher quantity of charge can be stored in the memory cell.

Figure 2:
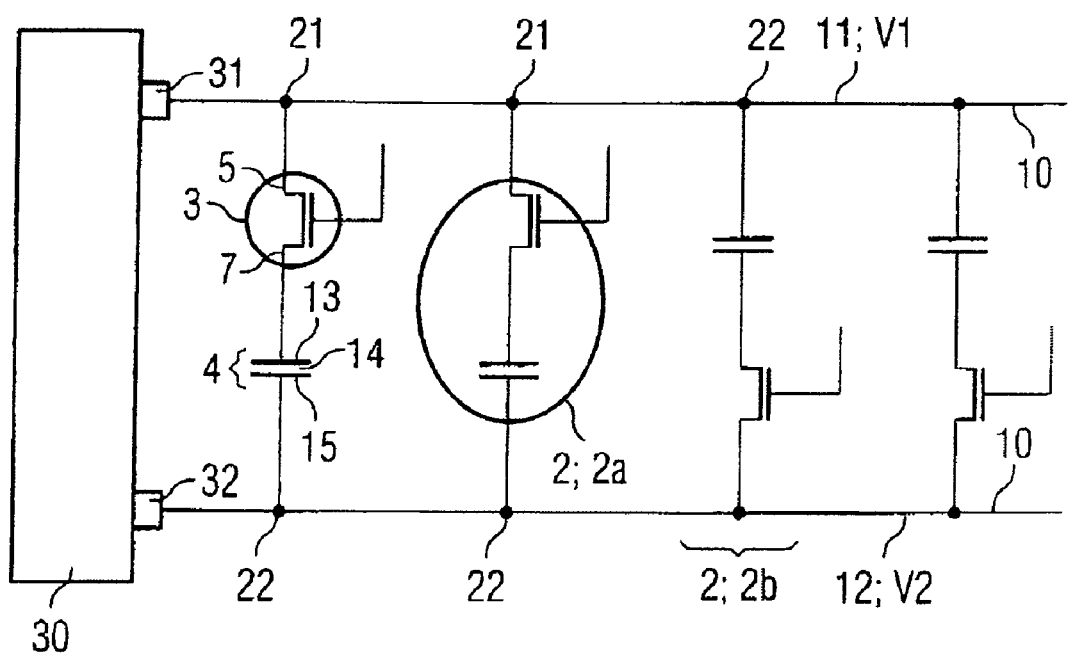
FIG. 2 shows a schematic plan view of a detail from the semiconductor circuit from FIG. 1.

FIG. 2 shows a plan view of a detail from the semiconductor memory according to the invention from FIG. 1. The sense amplifier 30 is arranged on the left in FIG. 2. Two mutually complementary bit lines of a bit line pair 10, namely a first bit line 11 and a second bit line 12, are connected to two contact connections 31, 32 of the sense amplifier 30. Memory cells 2 are in each case connected to the two bit lines, which memory cells, according to the invention, are also connected to the respective other, complementary bit line, namely by an electrode of the storage capacitor. The memory cells 2 each have a selection transistor 3 and a storage capacitor 4, which are merely represented by circuit symbols in FIG. 2. The first capacitor electrode 13 of the storage capacitor 4 is connected to a source/drain region 7 of the selection transistor 3. The other, second capacitor electrode 15, according to the invention, is connected to the respective other bit line, to be precise with the aid of a second contact connection 22, which is merely represented as an interconnect section in FIG. 2. The selection transistors 3 are connected by one of their source/drain regions 5 to a bit line in each case via a first contact connection 21, as also in the case of a conventional memory cell. FIG. 2 shows a total of four memory cells, which are representative of a multiplicity of memory cells. Two memory cells 2a are illustrated, the selection transistors 3 of which are connected to the first bit line 11 and the storage capacitors 4 of which are connected to the second bit line 12. Furthermore, two second memory cells 2b are illustrated, the selection transistors 3 of which are connected to the second bit line 12 and the storage capacitors 4 of which are connected to the first bit line 11. This illustrates that preferably exactly the same number of first memory cells 2a as of second memory cells 2b are connected between the first 11 and the second bit line 12. This ensures that the capacitance of each bit line 11, 12—including the capacitor electrodes connected thereto—has the same magnitude and a quantity of charge having the same magnitude is thus required for the charge reversal of both bit lines.

Figure 3:
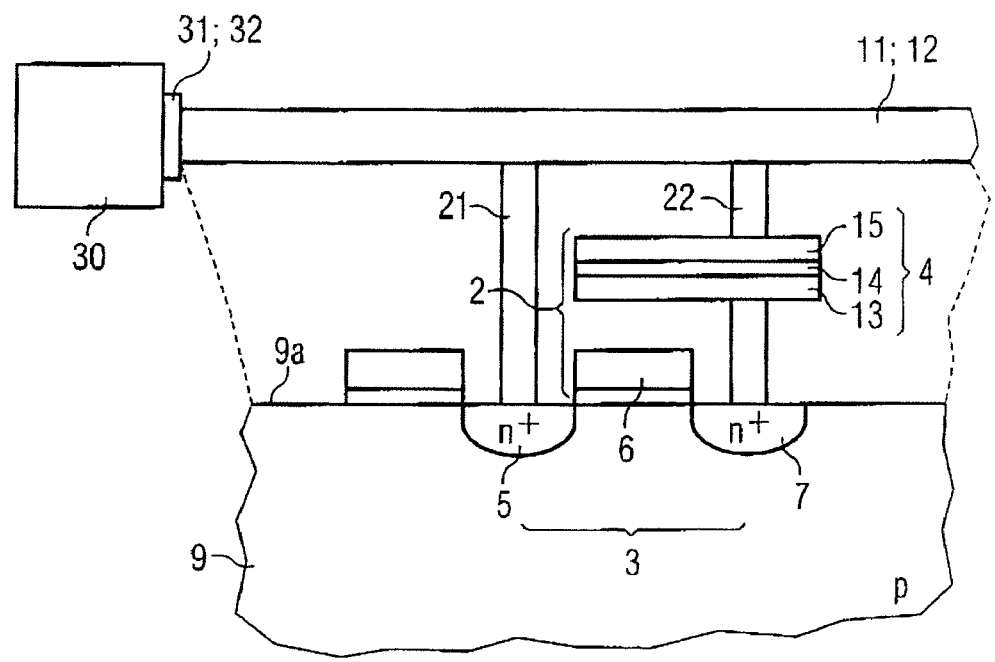
FIG. 3 shows a schematic cross-sectional view of the detail from the semiconductor memory from FIG. 2 in the region of a memory cell.
Figure 4:
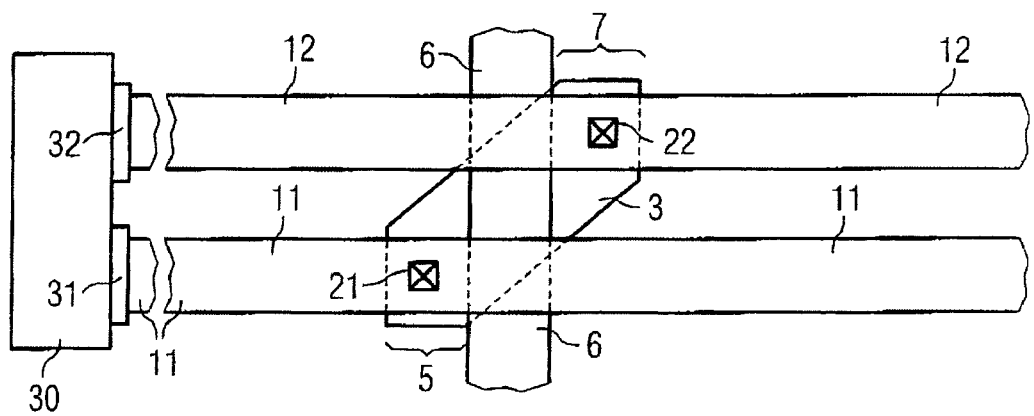
FIG. 4 shows a plan view of the memory cell from FIG. 3.

FIG. 3 shows a cross-sectional view of a memory cell according to the invention of the semiconductor circuit from FIG. 2. The selection transistor 3 is formed in a semiconductor substrate 9, said selection transistor having a first source/drain region 5 and a second source/drain region 7, which are arranged in the semiconductor substrate 9. The channel region extends between them beneath the gate dielectric and the gate electrode formed by the word line 6. The bit lines 11, 12 run above the surface 9a of the semiconductor substrate 9. They are respectively connected in pairs to the sense amplifier 30. The memory cell 2 is connected to two mutually complementary bit lines 11, 12, which conceal one another in FIG. 3 but can be individually discerned in FIG. 4, which shows a plan view of the memory cell in accordance with FIG. 3. As illustrated in FIG. 3, the first source/drain region 5 of the selection transistor 3 is connected by a first contact connection 21 to a bit line, to be precise to the first bit line 11, as illustrated in FIG. 4. As can be discerned in FIG. 3, the second source/drain region 7 is connected to a bottom capacitor electrode 13 of the storage capacitor 4. A contact hole filling is provided for this purpose. As illustrated in FIG. 3, the storage capacitor 4, which is a stacked capacitor, is arranged at a level above the semiconductor substrate between the plane of the word lines and the plane of the bit lines. The second capacitor electrode 15 of the storage capacitor 4 is separated from the first capacitor electrode 13 by a capacitor dielectric 4 and is connected by a second contact connection 22, which is provided for the first time according to the invention, to a further bit line of the bit line pair which is connected to the sense amplifier 30. As can be discerned in FIG. 4, the second contact connection is connected to the second bit line 22. The cross-sectional area of the capacitor 4 is not illustrated in FIG. 4 for the sake of clarity. In return it emerges from FIG. 4, however, that the selection transistor 3 has two source/drain regions 5, 7, which are offset with respect to one another in the direction of the course of the word line 6. Consequently, the two source/drain regions 5, 7 do not lie opposite one another over their entire width, rather the first source/drain region 5 is arranged predominantly in the region below the first bit line 11 and the second source/drain region 7 is arranged predominantly in the region of the second bit line 12 of the bit line pair 10. As a result, the active region of the selection transistor bridges the lateral distance between the two bit lines to which the memory cell 3 is connected.

Figure 5:
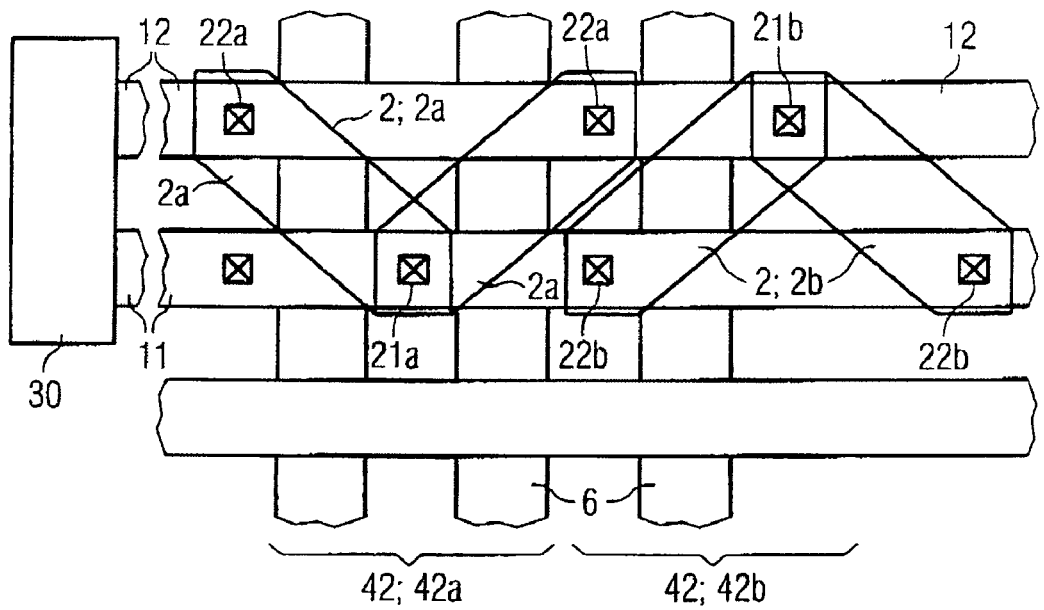
FIG. 5 shows a schematic plan view of a detail from the semiconductor memory according to the invention.

FIG. 5 shows a further plan view of a semiconductor memory according to the invention. The illustrated detail from the cell array illustrates in each case two pairs 42 of memory cells which in each case have a common first contact connection, to be precise pairs 42a of first memory cells 2a, which are connected by a common first contact connection 21a to a first bit line, and also pairs 42b of second memory cells 2b, which are connected by a common first contact connection 21b to a second bit line 12, which is connected to the same sense amplifier 30 as the first bit line 11. In the case of each pair 42a; 42b of memory cells with a common first contact connection 21a, 21b, a doubled number of second contact connections 22a; 22b is required for connecting the storage capacitors to the complementary bit line. Therefore, the pairs 42a; 42b are arranged in such a way that with their first contact connection 21a; 21b they alternatively make contact with either the first 11 or the second bit line 12, which are connected to the same sense amplifier 30. In the interspace between in each case two word lines, two second contact connections 22a, 22b are arranged in the region of the mutually complementary bit lines 11, 12, of which contact connections one is associated with a pair of first memory cells 2b and another is associated with a pair of second memory cells 2b. Between those mutually adjacent word lines, however, between which a common contact connection 21a or 21b of a bit line pair is in each case arranged, no further contact connection is required in the region of the two bit lines 11, 12. In this region, the basic substrate area can be utilized for an enlarged capacitor area at the level of the contact connections.

Figure 6:
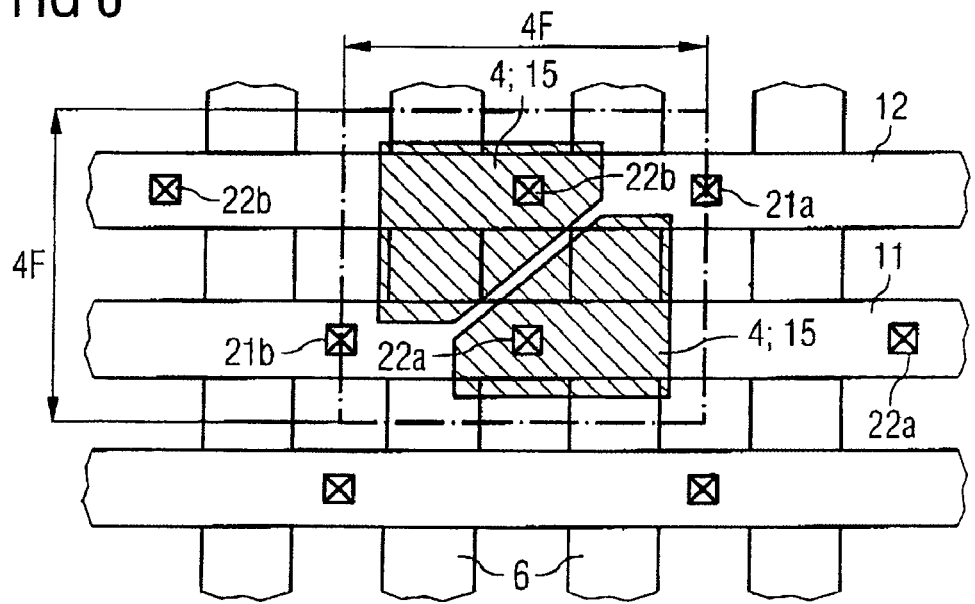
FIG. 6 shows a further schematic plan view of the semiconductor memory in accordance with FIG. 5.

FIG. 6 shows a further schematic plan view of the semiconductor memory in accordance with FIG. 5. FIG. 6 illustrates the lateral dimensions of the storage capacitors 4 associated with in each case a first 2a and a second memory cell 2b from FIG. 5. The common first contact connections 21a and 21b associated with the pairs 42 of first 2a or second bit lines 2b are likewise illustrated. The first contact connections 21a, 21b extend from the respective first source/drain region 5 (FIG. 3) arranged in the active region of the selection transistor as far as the respective first or second bit line 11, 12. In the plan view of FIG. 6, therefore, the lateral dimensions of the storage capacitors 4 and of their capacitor electrodes can reach almost as far as the first contact connections 21a, 21b. The second contact connections 22a, 22b, however, which extend precisely from the second capacitor electrodes 15 as far as the respective bit line 11, 12, must be arranged within the capacitor area in the plan view of FIG. 6. The first capacitor electrodes 13, concealed by the second capacitor electrodes 15 in FIG. 6, have the same lateral dimensions and contours as in the second capacitor electrodes 15, in the same way as the capacitor dielectric. However, the arrangement illustrated in FIG. 6 is merely by way of example with regard to the lateral dimensions or the optionally three-dimensional configurations of the capacitor areas.

FIG. 6 reveals that, in the case of a semiconductor memory according to the invention, each memory cell requires only a basic substrate area having a size of $8F^2$, where F is the minimum feature size that can be obtained by means of the lithographic exposure device with which the semiconductor circuit was fabricated. The parameter F will generally correspond to the width of the word lines or the bit lines and the mutual distance between word lines or bit lines. On the basis of the rectangle—illustrated in FIG. 6—having an edge length of in each case 4F in each lateral direction, this results in a size of $16F^2$ for two memory cells arranged therein. A first memory cell 2a and a second memory cell 2b are arranged within the rectangle. Consequently, each memory cell has a basic area of $8F^2$.

Figure 7:
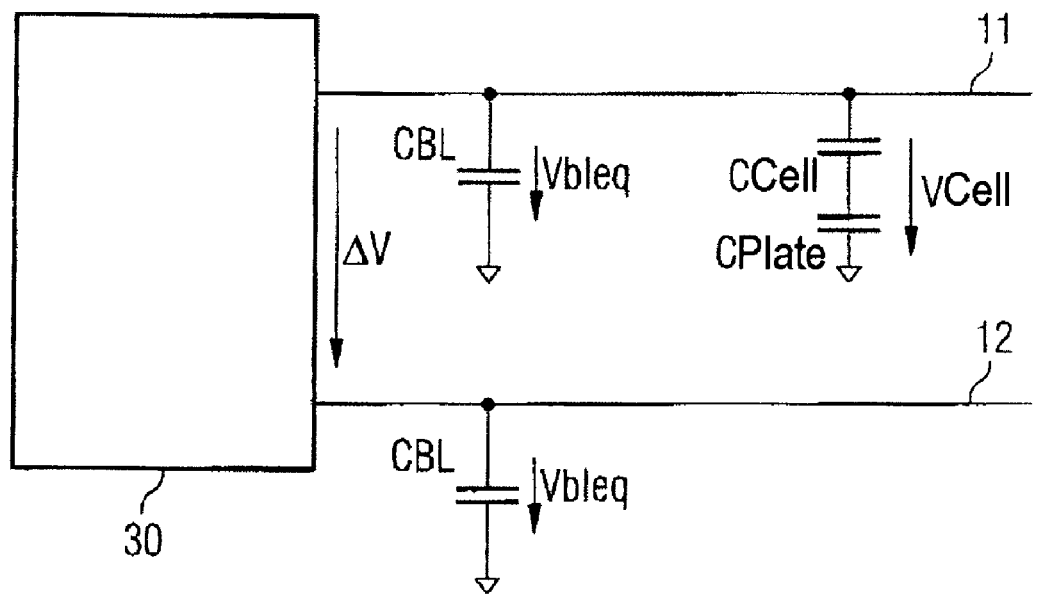
FIG. 7 shows a schematic circuit diagram of part of a conventional semiconductor memory.

FIG. 7 shows a schematic circuit diagram of a conventional semiconductor memory having two mutually complementary bit lines 11, 12 which are connected to the same sense amplifier 30. The capacitances of the individual structure elements, for example of the bit lines and of the memory cells, are additionally illustrated. In the left-hand region of the bit lines 11, 12 which is arranged closer to the sense amplifier, the potentials and the capacitances are illustrated for a conventional memory cell at the instant at which the two bit lines are biased with the precharge potential Vbleq. Both thus have the same potential and the same potential difference Vbleq with respect to a neutral potential such as, for example, the ground potential of zero volts. The bit lines 11, 12 each have a bit line capacitance CBL and the memory cell has a cell capacitance, which essentially results from the capacitance of the storage capacitor and depends in particular on the layer thickness of the capacitor dielectric. Moreover, the second capacitor electrodes of the capacitances of all the memory cells are short-circuited among one another. They are biased with a predetermined electrical potential with respect to the ground potential by means of a plate voltage generator (not illustrated pictorially here). If it is assumed in a simplifying manner that the capacitance of the plate voltage generator is significantly greater than the capacitance of a memory cell, as is realistic in the case of semiconductor memories, then, after the selection transistor has been opened, a voltage difference ΔV arises between the two bit lines 11, 12, said voltage difference resulting from the equation:

$$\Delta V = (VCell - Vbleq) \cdot \frac{CCell}{(CCell + CBL)}$$

In this case, Ccell is once again the capacitance of the memory cell, CBL is the capacitance of the bit line, Vbleq is the precharge potential and Vcell is that voltage with which the bit line 11 to which the memory cell is connected was originally biased. This potential is Vblh, for example. It may likewise be equal to the ground potential. The value Vblh is used for the present calculation, however. Consequently, the level of the voltage to be spread, $\Delta V = 0.5$ Vblh, is multiplied by a factor which specifies the ratio of the cell capacitance to the sum of the capacitances of cell and bit line.

Figure 8:
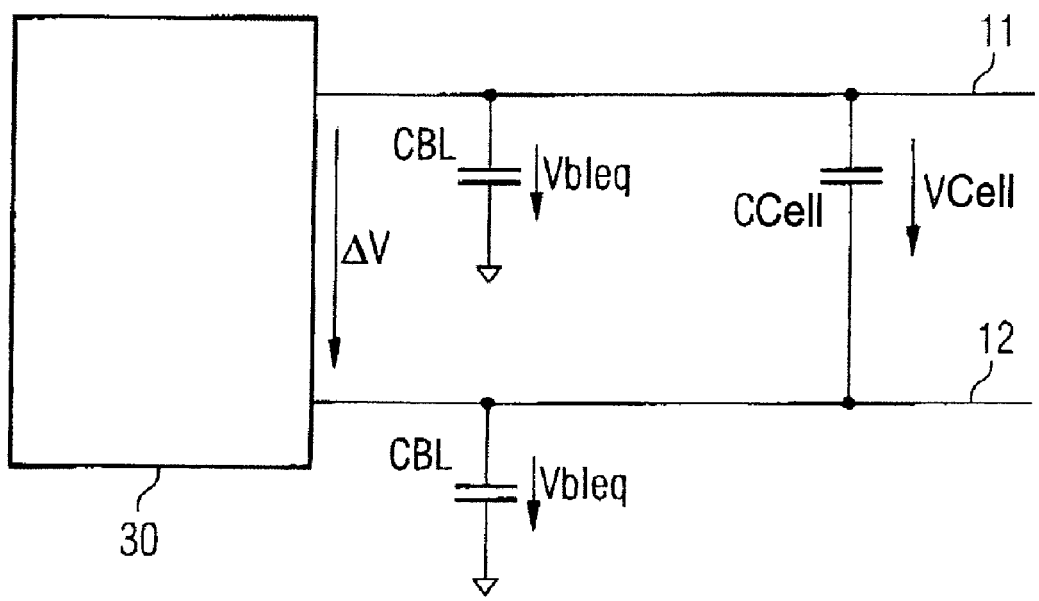
FIG. 8 shows a schematic circuit diagram of a part of a semiconductor memory according to the invention.

FIG. 8 shows a schematic circuit diagram of a semiconductor memory according to the invention, in which the second capacitor electrode is connected to the complementary bit line. The type of illustration corresponds to FIG. 7. In FIG. 8, likewise as in the case of a conventional semiconductor memory, the bit lines 11, 12 are firstly biased with the precharge potential Vbleq before the selection transistor of the memory cell is opened.

When the selection transistor is turned on and thus opened, a voltage difference of the level of two Vblh can be applied to the two bit lines if a potential difference present previously between the two bit lines has been spread. However, such a high voltage having the magnitude of 2 Vblh or (−2 Vblh) is also present between the two capacitor electrodes 13, 15; the charge of the storage capacitor that is stored on account of this high voltage is distributed between the bit lines when the selection transistor is opened. The potential difference ΔV between the two bit lines 11, 12 which arises as a result of the opening of the selection transistor is thus calculated as $$\Delta V = 2 \cdot VCell \cdot \frac{CCell}{(2 \cdot CCell + CBL)}$$

In this case, Vcell has a magnitude of 2 Vblh and is thus four times as large as the potential difference of (Vblh−Vbleq) used in a conventional semiconductor memory for the charging of the storage capacitor. Approximately a quadrupling in the signal strength and the potential difference to be spread is achieved as a result. In practice, an increase by a factor of approximately 3.5 can be expected. Even when the layer thickness of the capacitor dielectric 14 is increased, for example doubled, in order to prevent a voltage breakdown from arising in the storage capacitor, a considerable signal amplification of between 1.5 and 2 is still obtained.

The method for operating a semiconductor memory according to the invention proceeds in exactly the same way as the method for operating a conventional semiconductor memory. In particular as in the case of a conventional semiconductor memory, the two mutually complementary bit lines 11, 12 are biased with the precharge potential before the selection transistor of the memory cell is turned on. The level of the precharge potential of Vbleq=0.5 Vblh is also unchanged with respect to a conventional semiconductor memory. However, on account of this constructional feature that the second capacitor electrode 15 of the storage capacitor 4 is conductively connected to the complementary, second bit line 12 (by a second contact connection 22), this results in a much greater signal strength when charging the storage capacitor (during the refreshing or the writing of an item of information to the memory cell). Likewise when reading out a previously stored item of information (that is to say likewise during reading). The signal strengths having a magnitude increased by two-fold and four-fold which are thereby achieved make the semiconductor memory insensitive to signal losses that arise if the sense amplifiers are operated at an operating point below the threshold voltage of their transistors, for instance in order to be able to operate the selection transistors for the memory cells with a lower operating voltage. Even when deviating from the principle of mid-level sensing, the semiconductor memory according to the invention can be operated reliably and without losses of data.

In the case of an arbitrary memory cell, the selection transistor thereof is in each case connected to one of two bit lines, which is associated with a pair of bit lines which are connected to the same sense amplifier. By virtue of the fact that the second capacitor electrode of the storage capacitor (which is not connected to the selection transistor) is directly connected to the other bit line of the same pair of bit lines, the second capacitor electrode is permanently short-circuited with this other bit line of the pair of bit lines. As a result, according to the invention, a larger quantity of charge can be stored in the capacitor. The second capacitor electrode is preferably connected to the other bit line via only one contact hole filling. In particular, no active switching elements, in particular no further transistors, are connected between the second capacitor electrode and the other bit line of the bit line pair. This ensures that the second capacitor electrode is directly short-circuited with the other bit line and in each case assumes the same electrical potential as said other bit line.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

The invention claimed is:

1. An integrated semiconductor memory device comprising at least one memory cell, at least one sense amplifier and a pair of bit lines connected to each sense amplifier, and each memory cell includes a selection transistor and a storage capacitor;

wherein:

the storage capacitor of each memory cell includes a first capacitor electrode and a second capacitor electrode;

the selection transistor of each memory cell includes a first source/drain region that is connected by a first contact connection to one bit line of a pair of bit lines corresponding with the memory cell, and a second source/drain region that is conductively connected to the first capacitor electrode of the storage capacitor of the memory cell;

the second capacitor electrode of the storage capacitor of each memory cell is directly connected to and permanently short-circuited with the other bit line of the pair of bit lines corresponding with the memory cell; and the two bit lines of the pair of bit lines that are connected to each sense amplifier are configured to be biased by the respective sense amplifier such that an existing potential difference between a potential of one bit line and a potential of the other bit line of the pair is increased, with one of the bit lines of the pair being biased with a first potential that is output at a first connection of the respective sense amplifier and the other bit line of the pair being biased with a second potential that is output at a second connection of the respective sense amplifier.

2. The semiconductor memory device of claim 1, wherein the second capacitor electrode is connected by a second contact connection to the other bit line of the pair of bit lines corresponding with the memory cell.

3. The semiconductor memory device of claim 2, wherein each memory cell is connected between the two bit lines of the pair of bit lines corresponding with the memory cell by the first contact connection and the second contact connection.

4. The semiconductor memory device of claim 2, wherein the first capacitor electrode of the storage capacitor of each memory cell is arranged closer to the surface of the semiconductor substrate than the second capacitor electrode and is connected to the second source/drain region of the respective selection transistor of each memory cell by a contact hole filling that covers the same region of the semiconductor substrate as the second contact connection.

5. The semiconductor memory device of claim 1, wherein the semiconductor memory device is controlled such that, during the refresh of a memory content of a memory cell, each of the two bit lines of the pair of bit lines that are connected to a respective sense amplifier biases one of the two capacitor electrodes of the storage capacitor of the memory cell.

6. The semiconductor memory device of claim 1, wherein the semiconductor memory device includes a plurality of memory cells, each of the memory cells being connected to both bit lines of the pair of bit lines corresponding with each memory cell, the selection transistors of the memory cells are connected to word lines that extend in a transverse direction with respect to a direction in which the bit lines extend, and the first source drain region and the second source drain region of each selection transistor are arranged offset with respect to one another in the direction in which the word lines extend.

7. The semiconductor memory device of claim 6, wherein one of the two source/drain regions of the selection transistor of each memory cell is arranged in a substrate region of a semiconductor substrate that is covered by one bit line of the pair of bit lines corresponding with each memory cell, and the other source/drain region of the selection transistor of each memory cell is arranged in a substrate region of the semiconductor substrate that is covered by the other bit line of the pair of bit lines corresponding with each memory cell.

8. The semiconductor memory device of claim 1, wherein the semiconductor memory device includes at least one first memory cell and at least one second memory cell, the selection transistor of the first memory cell being connected by a first contact connection to a first bit line of a pair of bit lines corresponding with the first and second memory cells, and the selection transistor of the second memory cell being connected by a first contact connection to a second bit line of the pair of bit lines corresponding with the first and second memory cells.

9. The semiconductor memory device of claim 8, wherein the second capacitor electrode of the storage capacitor of the first memory cell is connected by a second contact connection to the second bit line of the pair of bit lines corresponding with the first and second memory cells, and the second capacitor electrode of the storage capacitor of the second memory cell is connected by a second contact connection to the first bit line of the pair of bit lines corresponding with the first and second memory cells.

10. The semiconductor memory device of claim 8, wherein the first memory cell and the second memory cell are connected oppositely in parallel with one another to the two bit lines corresponding with the first and second memory cells.

11. The semiconductor memory device of claim 1, wherein the semiconductor memory device includes pairs of memory cells, and the selection transistors of each of the pairs of memory cells are connected by the same first contact connection to a bit line of a pair of bit lines corresponding with the pairs of memory cells.

12. The semiconductor memory device of claim 11, wherein a first contact connection of a pair of first memory cells connects the selection transistors of the pair of first memory cells to the first bit line of the pair of bit lines corresponding with the pairs of memory cells, and a first contact connection of a pair of second memory cells connects the selection transistors of the pair of second memory cells to the second bit line of the pair of bit lines corresponding with the pairs of memory cells.

13. The semiconductor memory device of claim 12, wherein the number of first memory cells and the selection transistors that are connected to the first bit line of the pair of bit lines corresponding with the pairs of memory cells is equal in magnitude to the number of second memory cells and the selection transistors that are connected to the second bit line of the pair of bit lines corresponding with the pairs of memory cells.

14. The semiconductor memory device of claim 1, wherein the storage capacitor of each memory cell is a stacked capacitor.

15. The semiconductor memory device of claim 14, wherein the stacked capacitor of each memory cell is arranged at a level between a surface of the semiconductor substrate and the bit lines.

16. The semiconductor memory device of claim 1, wherein the first bit line and the second bit line of a pair of bit lines that are connected to the same sense amplifier are mutually complementary bit lines.

17. The semiconductor memory device of claim 1, wherein the selection transistor of each of the memory cell is a field effect transistor.

18. The semiconductor memory device of claim 1, wherein the semiconductor memory device comprises a volatile random access memory device.

19. A method for operating a semiconductor memory device that includes at least one memory cell, at least one sense amplifier and a pair of bit lines connected to each sense amplifier, wherein each memory cell includes a selection transistor and a storage capacitor, each storage capacitor includes a first capacitor electrode and a second capacitor electrode, each selection transistor includes a first source/drain region that is connected by a first contact connection to one bit line of a pair of bit lines corresponding with a respective memory cell and a second source/drain region that is conductively connected to the first capacitor electrode of the storage capacitor of the respective memory cell, and the second capacitor electrode of each storage capacitor is connected by a second contact connection to the other bit line of the pair of bit lines corresponding with the respective memory cell, wherein the method comprises:

opening a selection transistor of a memory cell; and applying a potential difference between potentials of the two bit lines of the pair of bit lines connected to the sense amplifier;

wherein the first capacitor electrode of the storage capacitor of the memory cell is biased with a first potential via a bit line of the pair of bit lines that is connected to a first connection of the sense amplifier and via the first contact connection, and the second capacitor electrode of the storage capacitor of the memory cell is biased with a second potential via a bit line of the pair of bit lines that is connected to a second connection of the sense amplifier and via the second contact connection.

20. The method of claim 19, wherein the first potential and the second potential with which the two capacitor electrodes of the storage capacitor of the memory cell are biased have a potential difference having an identical magnitude, but opposite sign, with respect to a neutral potential.

21. The method of claim 20, wherein, prior to a refresh of a memory content of the memory cell, the two bit lines to which the memory cell is connected via the first and the second contact connections are biased with a precharge potential having a potential difference with respect to the neutral potential that is half as large as that of the first potential.

22. A method of manufacturing a memory device, the method comprising:

forming at least one memory cell comprising a selection transistor and a storage capacitor, wherein the storage capacitor of each memory cell includes a first capacitor electrode and a second capacitor electrode, the selection transistor of each memory cell includes a first source/drain region that is connected to one bit line of a pair of bit lines corresponding with the memory cell and a second source/drain region that is conductively connected to the first capacitor electrode of the storage capacitor of the memory cell, and the second capacitor electrode of the storage capacitor of each memory cell is directly connected to and permanently short-circuited with the other bit line of the pair of bit lines corresponding with the memory cell; and connecting each pair of bit lines corresponding with each memory cell to a respective sense amplifier, wherein the pair of bit lines that are connected to each sense amplifier are biased by the respective sense amplifier such that an existing potential difference between a potential of one bit line and a potential of the other bit line of the pair is increased, with one of the bit lines of the pair being biased with a first potential that is output at a first connection of the respective sense amplifier and the other bit line of the pair being biased with a second potential that is output at a second connection of the respective sense amplifier.

* * * * *